(12) United States Patent
Chalasani

(10) Patent No.: US 6,255,801 B1
(45) Date of Patent: Jul. 3, 2001

(54) SYSTEM AND METHOD FOR ASSESSING A CAPACITY OF A BATTERY AND POWER PLANT INCORPORATING THE SAME

(75) Inventor: Subhas Chandra Chalasani, Plano, TX (US)

(73) Assignee: Tyco Electronics Logistics AG, Steinach/SG (CH)

( * ) Notice: Subject to any disclaimer, the term of this patent is extended or adjusted under 35 U.S.C. 154(b) by 0 days.

(21) Appl. No.: 09/567,735

(22) Filed: May 10, 2000

(51) Int. Cl.[7] .............................. H02J 7/04; G01N 27/416
(52) U.S. Cl. ........................... 320/132; 320/162; 324/433
(58) Field of Search .................................. 320/132, 134, 320/162; 702/63; 324/433, 432, 427

(56) References Cited

U.S. PATENT DOCUMENTS 5,977,750 * 10/1999 Ng et al. ............................... 320/132
6,137,292 * 10/2000 Hirsch et al. ......................... 324/427

OTHER PUBLICATIONS

"Estimation of VRLA Battery Capacity Using the Analysis of The Coup De Fouet Region" by Phillip E. Pascoe and Adnan H. Anbuky; Jun. 1999; 11 pp.
"The Voltage Characteristics of a Lead–Acid Cell During Charge and Discharge" by D. Berndt and E. Voss: Sep. 1964; pp. 17–27.

* cited by examiner

Primary Examiner—Peter S. Wong
Assistant Examiner—Gregory J. Toatley, Jr.

(57) ABSTRACT

A system for, and method of, assessing a capacity and/or age of a battery. In one embodiment, the system includes: (1) a voltage sensor, coupled to the battery, that develops a signal indicative of a parameter of a coup de fouet effect experienced by the battery as the battery is discharged and (2) a controller, coupled to the voltage sensor, that receives the signal and determines the capacity and/or age as a function thereof.

24 Claims, 3 Drawing Sheets

SYSTEM AND METHOD FOR ASSESSING A CAPACITY OF A BATTERY AND POWER PLANT INCORPORATING THE SAME

TECHNICAL FIELD OF THE INVENTION

The present invention is directed, in general, to batteries and, more specifically, to a system and method for assessing the capacity of a battery and a power plant employing the system or the method.

BACKGROUND OF THE INVENTION

The traditional reliability of telecommunication systems that users have come to expect and rely upon is based, in part, on the reliance on redundant equipment and power supplies. Telecommunication switching systems, for example, route tens of thousands of calls per second. The failure of such systems, due to either equipment breakdown or loss of power, is unacceptable since it may result in a loss of millions of telephone calls and a corresponding loss of revenue.

Power plants employable in standby applications (e.g., telecommunications, UPS applications) address the power loss problem by providing the system with an energy reserve (e.g., a battery) in the event of the loss of primary power to the system. Power plants employable in other applications (e.g., cyclic, photovoltaic or automotive applications) may likewise require an energy reserve in the event the primary power is insufficient (or unavailable) to power the entire system. For example, in cyclic applications, the energy reserve may be employed to supplement the primary power during periods of peak usage.

A power plant that powers telecommunications systems commonly includes a number of batteries, rectifiers and other power distribution equipment. The primary power is produced by the rectifiers, which convert an AC main voltage into a DC voltage to power the load equipment and to charge the batteries. The primary power may, however, become unavailable due to an AC power outage or the failure of one or more of the rectifiers. In either case, the batteries then provide power to the load. Redundant rectifiers and batteries may be added to the power plant as needed to increase the availability thereof.

The power plant commonly employs lead-acid batteries (e.g., valve-regulated lead-acid (VRLA) batteries) as the energy reserve. The batteries are typically coupled directly to the output of the rectifiers and may instantly provide power to the load in the event an AC power outage occurs. During normal operation, the batteries are usually maintained in a fully charged state to maximize a duration for which the batteries can provide energy to the load equipment.

As a battery ages, however, its capacity or energy-storage capability decreases thereby reducing a duration for which the battery can provide energy, even when fully charged. In many applications, particularly telecommunications applications, the battery is considered to have failed when its actual capacity has fallen below a threshold, such as 80% of its rated capacity (for some telecommunications applications). A failed battery should be replaced in an orderly fashion to maintain the availability of the power plant. It is crucial, therefore, to be able to assess whether the capacity of a particular battery has fallen below its threshold.

An accurate method for assessing the capacity of the battery is to fully discharge the battery. Completely discharging the battery to assess the capacity, however, may present major disadvantages. If an AC power outage occurs during or after the discharge test, but before the battery has been fully recharged, the full energy reserve provided by the battery will not be available. This obviously jeopardizes the availability of the power plant and the reliability of the telecommunications system (or other systems) powered therefrom. Further, since a battery may only be charged and discharged a finite number of times, each cycle of complete discharge and charge necessarily reduces the overall life span of the battery.

Other methods, such as an ohmic technique or a partial discharge coupled with algorithmic calculations, may also be employed. Although these methods may be conveniently performed and may be relatively quick when compared to the full discharge method, these methods have not proven to be highly accurate.

Accordingly, what is needed in the art is a system and method for assessing the capacity of a battery that provides an accurate measurement of the battery's capacity in a short amount of time yet maintains the availability of the power plant at a satisfactory level.

SUMMARY OF THE INVENTION

To address the above-described deficiencies of the prior art, the present invention provides, a system for, and method of, assessing a capacity of a battery. In one embodiment, the system includes: (1) a voltage sensor, coupled to the battery, that develops a signal indicative of a parameter of a coup de fouet effect experienced by the battery as the battery is discharged and (2) a controller, coupled to the voltage sensor, that receives the signal and determines the capacity as a function thereof.

The present invention, in one aspect, introduces the concept of determining the capacity of a battery as a function of at least one of various parameters, which may arise from a phenomenon known as "coup de fouet." As a fully charged battery is discharged, the voltage of the battery rapidly drops to a minimum voltage, herein is referred to as a "trough voltage." The voltage then recovers to maximum voltage, herein referred to as a "peak voltage." The voltage of the battery then gradually decreases from the peak voltage as the charge of the battery is dissipated. Depending on a rate at which the battery is being discharged and a temperature of the battery, the coup de fouet phenomenon may occur within one minute to within about 20 minutes. Since the trough voltage or the peak voltage may be sensed within a short time, usually a few minutes, after the discharge is initiated, the capacity of the battery may be determined without substantially discharging the battery.

Another aspect of the present invention provides a system for, and method of, assessing an age of a battery. In one embodiment, the system includes: (1) a voltage sensor, coupled to the battery, that develops a signal indicative of a parameter of a coup de fouet effect experienced by the battery as the battery is discharged and (2) a controller, coupled to the voltage sensor, that receives the signal and determines the age as a function thereof.

In one embodiment of the present invention, the parameter is a trough voltage of the battery. The controller may determine the capacity (or the age) of the battery as a function of the trough voltage. In an alternative embodiment, the parameter is a peak voltage of the battery. The controller may determine the capacity (or the age) of the battery as a function of the peak voltage. The controller may compare the trough voltage or the peak voltage of the battery under test to data obtained from discharging other similar batteries (but having varying capacities) to determine the capacity or the age of the battery under test.

The system advantageously discharges the battery until the trough voltage or the peak voltage is sensed. The battery need not be further discharged once the trough voltage or the peak voltage has been sensed, thereby reducing the amount of time required to discharge and recharge the battery.

In another embodiment of the present invention, the controller may receive a signal indicative of a battery voltage of the battery for a period of time while the battery is experiencing the coup de fouet effect and determine the capacity (or the age) of the battery as a function of a change or changes in the signal during the period of time. By periodically measuring the battery voltage during the period of time, the capacity (or the age) of the battery may be determined without necessitating discharge until the trough voltage or peak voltage is reached. The battery voltage of the battery under test may be plotted with respect to time and compared to data obtained from discharging other comparable batteries to determine the capacity (or the age) of the battery under test.

In one embodiment of the present invention, the system discharges the battery at a substantially constant discharge current. The sensor may thus sense the battery voltage without regard to current fluctuations, which may affect a level of the trough or peak voltage. Of course, the discharge current need not be substantially constant. In an alternative embodiment, the system discharges the battery at a substantially constant power level. The battery may provide more or less current as required to maintain its power output at a substantially constant level.

In one embodiment of the present invention, the system discharges the battery by a predetermined discharge amount. The predetermined amount may be determined relative to the occurrence of the trough voltage or the peak voltage within the discharge cycle. In an alternative embodiment, the system discharges the battery for a predetermined discharge interval. The discharge interval may be based, for example, on the amount of time required to sense, for example, the trough voltage or the peak voltage.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
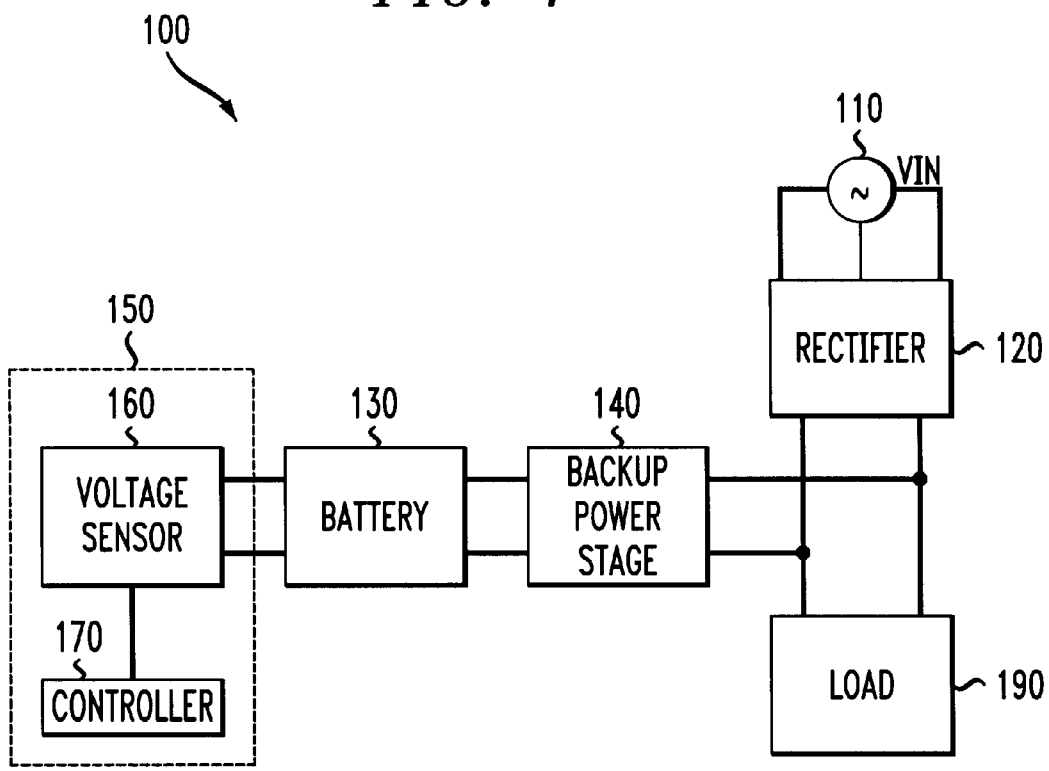
FIG. 1 illustrates a simplified block diagram of an embodiment of a power plant constructed in accordance with the principles of the present invention.

Referring initially to FIG. 1, illustrated is a simplified block diagram of an embodiment of a power plant 100 constructed in accordance with the principles of the present invention. The power plant 100 may be advantageously employed in various applications, such as telecommunications, UPS, cyclic, electric vehicle, photovoltaic or automotive applications.

The power plant 100 is coupled to a source of AC power 110 and provides DC power to a load 190. The power plant 100 includes a rectifier 120 coupled between the source 110 and the load 190. The power plant 100 further includes a battery 130 and a backup power stage 140 coupled to the rectifier 120. While the illustrated embodiment employs the backup power stage 140, those skilled in the art will realize that the backup power stage 140 is not required by the present invention and that the battery 130 may be directly coupled to the rectifier 120 or the load 190 as may be desired in a particular application.

The rectifier 120 converts the AC power from the source 110 to DC power employable to power the load 190 and to charge the battery 130 (via the backup power stage 140). The battery 130 is employed to power the load 190 when DC power from the rectifier 120 is not available or may be insufficient to power the load 190. Redundant rectifiers 120 and batteries 130 may be added to the power plant 100 as needed to increase the availability of the power plant 100.

The battery 130 may be a lead-acid battery, such as a valve-regulated lead-acid (VRLA) battery, a flooded lead-acid battery or any other type of battery, whether conventional or later-developed, that experiences a decrease in capacity over its lifetime. The capacity of the battery 130 may decrease as the battery 130 ages thereby reducing the duration for which the battery 130 can provide energy, even when fully charged. The aging of the battery 130 may depend on such operating conditions as temperature, voltage or frequency of discharge. The capacity of the battery 130 may decrease, for example, as the battery 130 is cycled through a number of charge/discharge cycles.

The power plant 100, therefore, further includes a system 150 for assessing a capacity of the battery 130. The system 150 includes a voltage sensor 160 coupled to the battery 130. The system 150 further includes a controller 170 coupled to the voltage sensor 160. The controller 170 may be a digital controller (e.g., a digital signal processor, a microprocessor), an analog controller or may include a combination of digital and analog circuitry. Digital circuitry may allow the controller 170 to directly interface with monitor and control equipment to warn of a decrease in the capacity of the battery 130.

The system 150 operates as follows. As the battery 130 is discharged, the voltage sensor 160 develops a signal indicative of a parameter of a coup de fouet effect experienced by the battery 130. The parameter may be a trough voltage, a peak voltage or a change in a battery voltage of the battery 130 while the battery is experiencing the coup de fouet effect.

In the illustrated embodiment, the voltage sensor 160 includes an analog-to-digital converter that samples the battery voltage. As the battery 130 discharges, an electrochemical reaction within the battery 130 causes the battery voltage to drop to a trough voltage in a relatively short time, depending, of course, on the discharge conditions. The battery voltage then recovers in, for example, a substantially exponential fashion, to a peak voltage after a further amount of time. The battery voltage then gradually decreases from the peak voltage as the charge of the battery 130 is dissipated. Depending on, among other things, the rate of discharge, the coup de fouet phenomenon may occur within one minute to within about 20 minutes.

The voltage sensor 160 may repeatedly compare a current sampled battery voltage with a previously sampled battery voltage to determine a trough voltage (or a peak voltage) of the battery 130. For example, one way to determine the trough voltage is to repeatedly or continually sample the battery voltage as it is decreasing. The trough voltage may then be determined once the battery voltage stops decreasing and begins to increase. The voltage sensor 160 may then develop a signal indicative of the trough voltage (or the peak voltage) of the battery 130 and provide the signal to the controller 170.

The controller 170 receives the signal and determines the capacity of the battery 130 as a function of the trough voltage, the peak voltage or both. It has been determined that the capacity of the battery 130 is substantially linearly related to its trough and peak voltages. By measuring the trough voltage, the peak voltage or both, the capacity of the battery 130 may thus be determined. In the illustrated embodiment, the controller 170 is a digital controller that employs a look-up table correlating the trough voltage (or the peak voltage) of the battery 130 to its capacity. Of course, the controller 160 may calculate the capacity of the battery 130 as a function of the trough voltage (or the peak voltage) without employing the look-up table.

While a substantially digital controller 170 is illustrated in the embodiment of FIG. 1, those skilled in the pertinent art will realize that the controller 170 may include an analog controller that employs analog circuitry to calculate the capacity of the battery 130 as a function of the trough voltage or the peak voltage.

In the illustrated embodiment, the system 150 discharges the battery 130 at a substantially constant discharge current. The voltage sensor 160 may thus sense the trough voltage (or the peak voltage) without regard to current fluctuations, which may affect a level of the trough voltage (or the peak voltage). Alternatively, the discharge may be at a substantially constant power level. Of course, this need not be the case.

The system 150 advantageously discharges the battery 130 until the trough voltage (or the peak voltage) has been sensed by the voltage sensor 160. Once the voltage has been sensed, the system 150 may recharge the battery 130 to maintain the high availability of the power plant 100. Since the trough voltage (or the peak voltage) may be sensed within a short time after discharge is initiated, the capacity of the battery 130 may be determined without substantially discharging the battery 130. Once the trough voltage (or the peak voltage) has been sensed, the battery 130 need not be further discharged but may be recharged to allow the battery 130 to provide the power plant 100 with the requisite availability. The controller 170 may then compare the trough voltage (or the peak voltage) of the battery 130 under test to data (such as trough voltage or peak voltage) obtained from other comparable batteries at various capacity levels to determine the capacity of the battery 130 under test.

Of course, the system 150 may, in an alternative embodiment, discharge the battery 130 by a predetermined discharge amount (e.g., about 1% to 5% of a full charge of the battery 130). The predetermined discharge amount may be calculated to provide the voltage sensor 160 with a sufficient probability of sensing the trough voltage (or the peak voltage), while preventing the battery 130 from being discharged past a certain level required to maintain the high availability of the power plant 100. The battery 130 may thus retain an adequate amount of energy for powering the load 190 in the event that the battery 130 is needed to provide power to the load 190 due to, for instance, a power outage that occurs during or after the discharge test, but before the battery 130 has been fully recharged.

In another alternative embodiment, the system 150 may discharge the battery 130 for a predetermined discharge interval (e.g., about 1 to 5 minutes). The predetermined discharge interval may be calculated to provide the voltage sensor 160 with a sufficient probability of sensing the trough voltage (or the peak voltage) while preventing the system 150 from discharging the battery 130 past a certain level required to maintain the power plant 100 at the appropriate availability level.

Alternatively, the system 150 may operate such that the controller 170 receives the signal indicative of a parameter of the coup de fouet effect for a period of time while the battery 130 is experiencing the coup de fouet effect and determines the capacity of the battery 130 as a function of the change in the signal during the period of time. For example, the battery voltage may be periodically measured for over a period of time. The change in battery voltage with respect to time may then be compared to data obtained from discharging other comparable batteries (but of varying capacities) to determine the capacity of the battery 130 under test. By periodically measuring the battery voltage, the capacity of the battery 130 may be determined without necessitating discharging the battery 130 until the trough voltage or the peak voltage is reached.

While the operation of the system 150 has been discussed with respect to the capacity of the battery 130, the system 150 may likewise be employed to determine the age of the battery 130.

Figure 2:
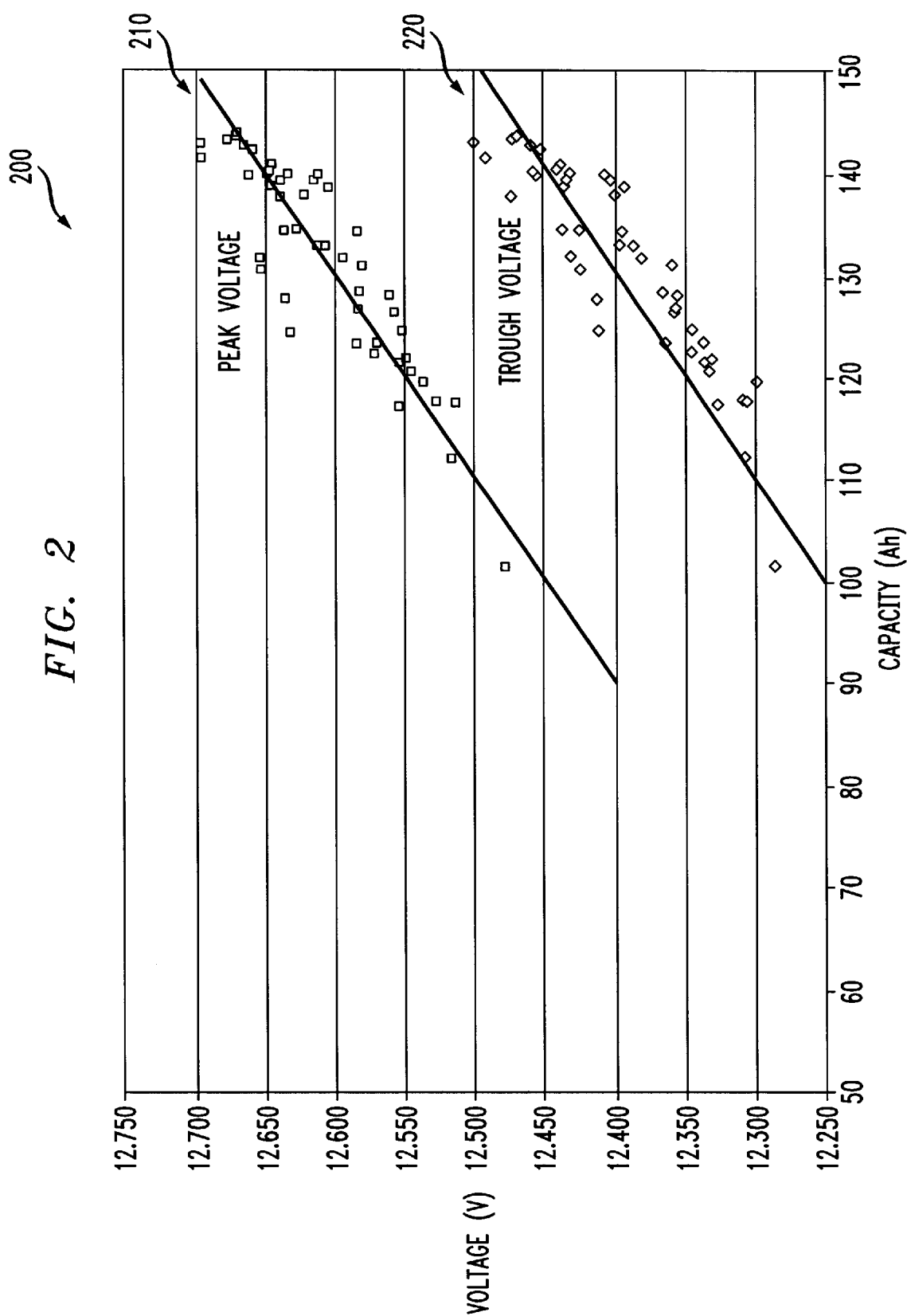
FIG. 2 illustrates an exemplary graph of peak voltages and trough voltages of batteries of varying age.

Turning now to FIG. 2, illustrated is an exemplary graph 200 of peak voltages 210 and trough voltages 220 of batteries of varying age. The graph 200 may be developed by measuring the peak and trough voltages 210, 220 of a battery (such as the battery 130 of FIG. 1) at a suitable discharge rate and at various intervals throughout its lifetime (as it ages). In the illustrated embodiment, the battery may be aged (e.g., by cooking the battery in an oven) to cause the capacity to decrease. The battery may then be fully discharged to determine its capacity, its peak voltage 210 and its trough voltage 220.

As illustrated, the batteries exhibit a substantially linear relationship between its peak voltages, trough voltages and capacities. Since the capacity of a battery decreases as the battery ages, the peak voltage and trough voltage are related to the battery's age. Therefore, the capacity (or the age) of another battery of the same type may be determined by sensing its peak or trough voltage and comparing the sensed voltage with that illustrated in the graph 200. By employing the relationship between the trough voltage (or the peak voltage) and the capacity (or the age) of the battery, the present invention allows the capacity (or the age) of the battery to be determined without substantially discharging the battery. While the graph of FIG. 2 illustrates a relationship between capacity and trough and peak voltages for a single battery, the relationship also applies to the case of a battery string of two or more batteries.

Figure 3:
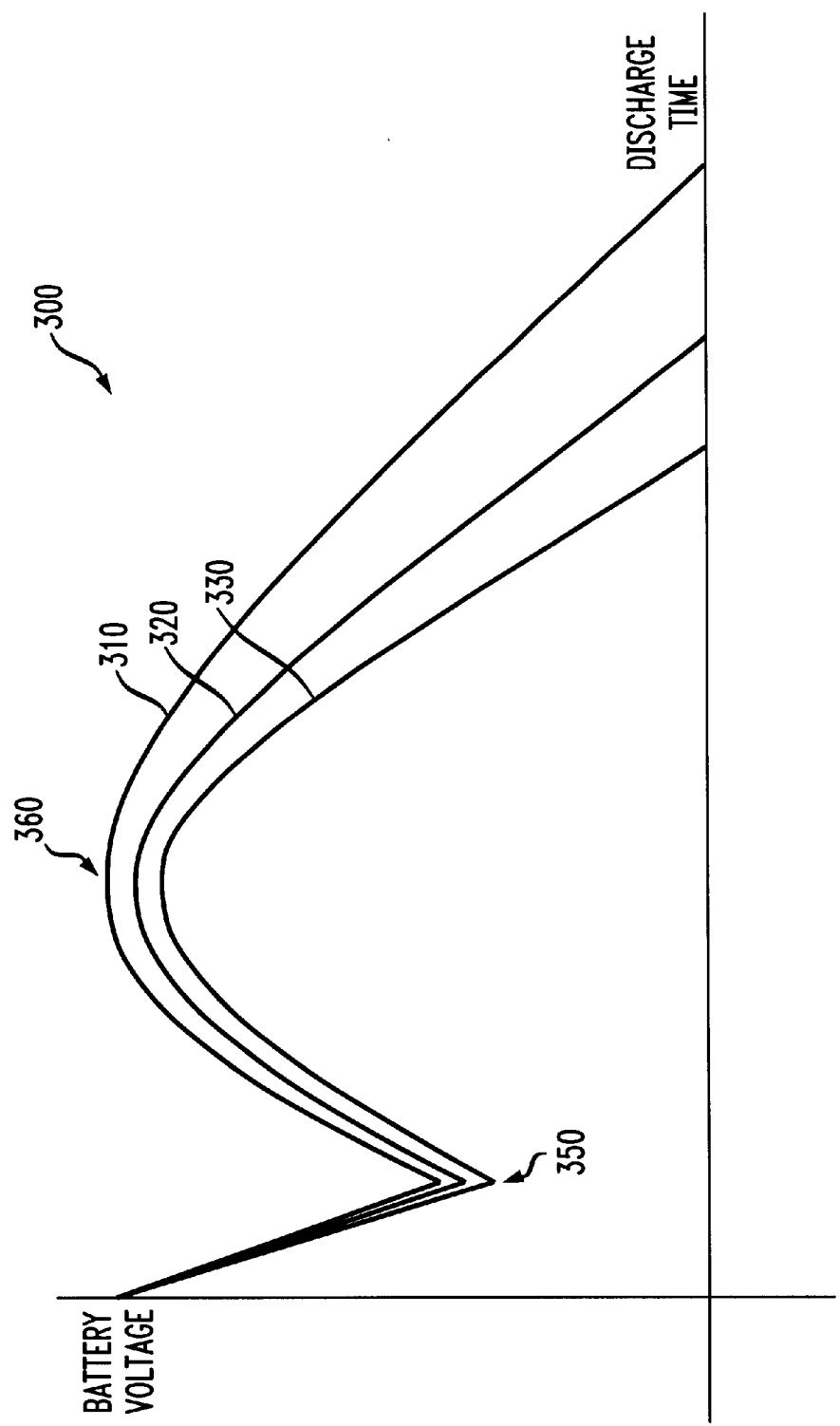
FIG. 3 illustrates an exemplary graph of discharge characteristics of an aging battery showing the coup de fouet effect.

Turning now to FIG. 3, illustrated is an exemplary graph 300 of discharge characteristics of an aging battery showing the coup de fouet effect. The graph 300 includes first, second and third battery voltage curves 310, 320, 330 at various capacities (e.g., as it ages). The graph 300 has been exaggerated to show the coup de fouet phenomenon experienced by the battery during discharge. As illustrated, the capacity of a particular battery is related to both its trough voltage 350 and its peak voltage 360.

Further, as illustrated in the graph 300, during an initial portion of battery discharge, as the battery voltage is decreasing towards the trough voltage 350, the rate of decrease may vary based on the capacity of the battery. Then, during a recovery period, the battery voltage rapidly recovers to the peak voltage 360. The rate of recovery is likewise based on the capacity of the battery. The capacity of the battery may, therefore, be determined based on the trough voltage 350, the peak voltage 360 or the rate of decrease or recovery of the battery voltage during discharge.

Those skilled in the art should understand that the previously described embodiment of the system for and method of assessing a capacity of the battery are submitted for illustrative purposes only and other embodiments capable of developing a signal indicative of a parameter of a coup de fouet effect experienced by the battery and determining therefrom the capacity of the battery are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa.

Although the present invention has been described in detail, those skilled in the art should understand that they can make various changes, substitutions and alterations herein without departing from the spirit and scope of the invention in its broadest form.

What is claimed is:

1. A system for assessing a capacity and/or age of a battery, comprising:

a voltage sensor, coupled to said battery, that develops a signal indicative of a parameter of a coup de fouet effect experienced by said battery as said battery is discharged; and a controller, coupled to said voltage sensor, that receives said signal and determines said capacity and/or age as a function thereof.

2. The system as recited in claim 1 wherein said parameter is a trough voltage of said battery, said controller determining said capacity and/or age as a function of said trough voltage.

3. The system as recited in claim 1 wherein said parameter is a peak voltage of said battery, said controller determining said capacity and/or age as a function of said peak voltage.

4. The system as recited in claim 1 wherein said controller receives said signal for a period of time while said battery is experiencing said coup de fouet effect and determines said capacity and/or age as a function of a change in said signal during said period.

5. The system as recited in claim 1 wherein said system discharges said battery at a substantially constant discharge current.

6. The system as recited in claim 1 wherein said system discharges said battery at a substantially constant power level.

7. The system as recited in claim 1 wherein said system discharges said battery by a predetermined discharge amount.

8. The system as recited in claim 1 wherein said system discharges said battery for a predetermined discharge interval.

9. A method of assessing a capacity and/or age of a battery, comprising:

developing a signal indicative of a parameter of a coup de fouet effect experienced by said battery as said battery is discharged; and determining said capacity and/or age as a function of said signal.

10. The method as recited in claim 9 wherein said parameter is a trough voltage of said battery, said determining comprising determining said capacity and/or age as a function of said trough voltage.

11. The method as recited in claim 9 wherein said parameter is a peak voltage of said battery, said determining comprising determining said capacity and/or age as a function of said peak voltage.

12. The method as recited in claim 9 further comprising:

receiving said signal for a period of time while said battery is experiencing said coup de fouet effect; and determining said capacity and/or age as a function of a change in said signal during said period.

13. The method as recited in claim 9 further comprising discharging said battery at a substantially constant discharge current.

14. The method as recited in claim 9 further comprising discharging said battery at a substantially constant power level.

15. The method as recited in claim 9 further comprising discharging said battery by a predetermined discharge amount.

16. The method as recited in claim 9 further comprising discharging said battery for a predetermined discharge interval.

17. A power plant, comprising:

a rectifier coupled to a load;

a battery coupled to said rectifier and said load; and a system for assessing a capacity and/or age of said battery, including:

a voltage sensor, coupled to said battery, that develops a signal indicative of a parameter of a coup de fouet effect experienced by said battery as said battery is discharged; and a controller, coupled to said voltage sensor, that receives said signal and determines said capacity and/or age as a function thereof.

18. The power plant as recited in claim 17 wherein said parameter is a trough voltage of said battery, said controller determining said capacity and/or age as a function of said trough voltage.

19. The power plant as recited in claim 17 wherein said parameter is a peak voltage of said battery, said controller determining said capacity and/or age as a function of said peak voltage.

20. The power plant as recited in claim 17 wherein said controller receives said signal for a period of time while said battery is experiencing said coup de fouet effect and determines said capacity and/or age as a function of a change in said signal during said period.

21. The power plant as recited in claim 17 wherein said system discharges said battery at a substantially constant discharge current.

22. The power plant as recited in claim 17 wherein said system discharges said battery at a substantially constant power level.

23. The power plant as recited in claim 17 wherein said system discharges said battery by a predetermined discharge amount.

24. The power plant as recited in claim 17 wherein said system discharges said battery for a predetermined discharge interval.

* * * * *